US012568722B2

(12) United States Patent
Qu et al.

(10) Patent No.: US 12,568,722 B2
(45) Date of Patent: Mar. 3, 2026

(54) LIGHT SOURCE COMPONENT, DISPLAY APPARATUS, AND MOBILE TERMINAL

(71) Applicant: HUAWEI TECHNOLOGIES CO., LTD., Shenzhen (CN)

(72) Inventors: Shuang Qu, Dongguan (CN); Quanbin Zhou, Dongguan (CN); Jinyu Shao, Dongguan (CN); Minghui Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 427 days.

(21) Appl. No.: 18/353,933

(22) Filed: Jul. 18, 2023

(65) Prior Publication Data

US 2023/0361253 A1 Nov. 9, 2023

Related U.S. Application Data

(63) Continuation of application No. PCT/CN2021/120895, filed on Sep. 27, 2021.

(30) Foreign Application Priority Data

Jan. 19, 2021 (CN) .......................... 202110066742.4

(51) Int. Cl.
H10H 20/841 (2025.01)
H01L 25/075 (2006.01)
H10H 20/831 (2025.01)

(52) U.S. Cl.
CPC ....... H10H 20/841 (2025.01); H01L 25/0753 (2013.01); H10H 20/8314 (2025.01)

(58) Field of Classification Search
CPC .. H10H 20/841; H10H 20/8314; H10H 20/84; H10H 20/835; H10H 20/8514; H10H 20/816; H10H 20/82; H01L 25/0753
See application file for complete search history.

(56) References Cited

U.S. PATENT DOCUMENTS 10,297,722 B2     5/2019  Chang et al.
2014/0050244 A1*  2/2014  Ohno ................... H10H 20/819
                                            372/46.01
(Continued)

FOREIGN PATENT DOCUMENTS

CN      110571317 A     12/2019
CN      111403566 A      7/2020
JP      2020181980 A    11/2020

OTHER PUBLICATIONS

Extended European Search Report dated Jun. 12, 2024, issued for European Application No. 21920643.0 (8 pages).

(Continued)

*Primary Examiner* — Mark W Tornow

(57) ABSTRACT

A light source component, for a display apparatus and/or a mobile terminal, includes a first semiconductor layer, a light emitting layer, and a second semiconductor layer that are laminated. The light emitting layer is located between the first semiconductor layer and the second semiconductor layer. A surface that is of the second semiconductor layer and that is away from the light emitting layer is an out-light surface. A side surface of the semiconductor layer has a surface non-radiative recombination center. When the light source component works, the surface non-radiative recombination center captures a carrier in the semiconductor layer, and non-radiative recombination of the carrier occurs on the side surface. This reduces light emitting efficiency of the light source component.

20 Claims, 6 Drawing Sheets

(56) References Cited

U.S. PATENT DOCUMENTS

| | | | |
|---|---|---|---|
| 2019/0044306 A1* | 2/2019 | Tanahashi | H01S 5/3072 |
| 2019/0288156 A1* | 9/2019 | Chaji | H01L 25/167 |
| 2020/0044117 A1* | 2/2020 | Vierheilig | H10H 20/0133 |
| 2022/0376134 A1* | 11/2022 | Biebersdorf | H10H 20/0133 |

OTHER PUBLICATIONS

Notice of Reasons for Rejection dated Jul. 2, 2024, issued for Japanese Application No. 2023-543096 (3 pages), and translation (3 pages).

* cited by examiner

LIGHT SOURCE COMPONENT, DISPLAY APPARATUS, AND MOBILE TERMINAL

CROSS-REFERENCE TO RELATED APPLICATION

This application is a continuation of International Application No. PCT/CN2021/120895, filed on Sep. 27, 2021, which claims priority to Chinese Patent Application No. 202110066742.4, filed on Jan. 19, 2021. The disclosures of the aforementioned applications are hereby incorporated by reference in their entireties.

TECHNICAL FIELD

This disclosure relates to the field of display technologies, and in particular, to a light source component, a display apparatus, and a mobile terminal.

BACKGROUND

A micro-LED (micro light emitting diode) is a new generation display technology. Compared with conventional OLED (organic light emitting diode) and LCD (liquid crystal display) technologies, the micro-LED has obvious advantages such as fast response, autonomous light emitting, high luminance, low power consumption, and ultra-high resolution and color saturation, and is a current research hotspot and key investment direction in the display field.

A display scenario of a mobile terminal such as a watch or a mobile phone is very sensitive to power consumption of a micro-LED. The micro-LED needs to work at low current density and has high light emitting efficiency in this current range. In addition, the micro-LED needs a small light emitting angle and high normal luminance to ensure sufficient light energy utilization, thereby ensuring that power consumption of a display module meets a system requirement. However, the current micro-LED has low light emitting efficiency at low current density, and cannot meet a requirement of the mobile terminal.

SUMMARY

This disclosure provides a light source component, a display apparatus, and a mobile terminal, to improve light output efficiency of the light source component.

According to a first aspect, a light source component is provided. The light source component is applied to a display apparatus, and is configured to provide display for the display apparatus. The light source component is an LED assembly. A main structure of the light source component includes a first semiconductor layer, a light emitting layer, and a second semiconductor layer that are laminated. The light emitting layer is located between the first semiconductor layer and the second semiconductor layer. A surface that is of the second semiconductor layer and that is away from the light emitting layer is an out-light surface. The first semiconductor layer and the second semiconductor layer each have a surface non-radiative recombination center. When the light source component works, the surface non-radiative recombination center captures a carrier in the semiconductor layer. This reduces light emitting efficiency of the light source component. To overcome the foregoing problem, the light source component in this disclosure is further provided with a conductive layer. The conductive layer may adjust and control, through electric field force, the carrier to be far away from at least one of the two surface non-radiative recombination centers. In this way, the carrier is far away from the surface non-radiative recombination center of the semiconductor layer under an action of the electric field force, thereby reducing a case in which the carrier is captured by the surface non-radiative recombination center, and improving light output efficiency of the light source component.

In a specific implementable solution, the conductive layer at least covers a side surface of the first semiconductor layer and a side surface of the second semiconductor layer. The light source component further includes: a first electrode electrically connected to the first semiconductor layer and a second electrode electrically connected to the second semiconductor layer. The conductive layer is electrically connected to at least one of the first electrode and the second electrode. The first electrode or the second electrode is used as a connection terminal of the conductive layer. When the light source component is used, the conductive layer may be charged by using the first electrode or the second electrode, so that electric field force may be applied to a carrier close to the surface non-radiative recombination center.

The conductive layer may be specifically disposed in different manners. In an optional solution, the conductive layer includes a first conductive layer and a second conductive layer that are electrically isolated. That is, the conductive layer includes the first conductive layer and the second conductive layer. The first conductive layer is located on an outer side of the side surface of the first semiconductor layer, and the second conductive layer is located on an outer side of the side surface of the second semiconductor layer. The first conductive layer is electrically connected to the first electrode, and the second conductive layer is electrically connected to the second electrode. The first electrode and the second electrode supply power to the corresponding first conductive layer and second conductive layer, respectively, so that the first conductive layer and the second conductive layer apply electric field force to carriers in the corresponding first semiconductor layer and second semiconductor layer, respectively.

In another optional solution, the conductive layer includes a third conductive layer. The third conductive layer is located on an outer side of side surfaces of the first semiconductor layer, the light emitting layer, and the second semiconductor layer. The third conductive layer is electrically connected to the first electrode, or the third conductive layer is electrically connected to the second electrode. For example, the third conductive layer is electrically connected to the first electrode and is electrically isolated from the second electrode; or the third conductive layer is electrically connected to the second electrode and is electrically isolated from the first electrode.

In a specific implementable solution, a surface that is of the conductive layer and that faces the first semiconductor layer and the second semiconductor layer is a reflective surface. Light emitted from the side surfaces of the first semiconductor layer, the second semiconductor layer, and the light emitting layer may be reflected back into the foregoing layer structure through the reflective surface, thereby increasing an amount of light output from the out-light surface of the second semiconductor layer.

In a specific implementable solution, the reflective surface of the conductive layer at least covers a part of each of surfaces that are of the first semiconductor layer and the second semiconductor layer and that are away from the out-light surface. This further increases the amount of light output from the out-light surface.

In a specific implementable solution, when the conductive layer includes the first conductive layer and the second conductive layer, the first conductive layer at least covers a part of a surface that is of the first semiconductor layer and that is away from the out-light surface, and the second conductive layer at least partially covers a surface that is of the second semiconductor layer and that is away from the out-light surface.

In a specific implementable solution, when the conductive layer includes the third conductive layer, the third conductive layer at least covers a part of each of surfaces that are of the first semiconductor layer and the second semiconductor layer and that are away from the out-light surface. For example, the third conductive layer covers only the surface that is of the first semiconductor layer and that is away from the out-light surface, or covers only the surface that is of the second semiconductor layer and that is away from the out-light surface, or covers both the surfaces that are of the first semiconductor layer and the second semiconductor layer and that are away from the out-light surface.

In a specific implementable solution, the light source component further includes a first passivation layer that covers the side surface of the first semiconductor layer, the side surface of the light emitting layer, and the side surface of the second semiconductor layer. The conductive layer covers an outer side of the first passivation layer. The conductive layer is isolated from the first semiconductor layer, the light emitting layer, and the second semiconductor layer by the first passivation layer.

In a specific implementable solution, the light source component further includes a second passivation layer that covers an outer side of the conductive layer. The second passivation layer is used as a protective layer to protect function layers of the light source component.

In a specific implementable solution, the light source component further includes an anti-reflective coating layer disposed on the out-light surface. The anti-reflective coating layer is used to reduce total reflection of the out-light surface, thereby improving light output efficiency.

In a specific implementable solution, the anti-reflective coating layer is a layer structure with a gradient refractive index, and a refractive index of the anti-reflective coating layer gradually decreases in a direction away from the light emitting layer. This further improves light output efficiency.

In a specific implementable solution, the anti-reflective coating layer covers an exposed surface of the conductive layer. The anti-reflective coating layer and the second passivation layer together form an insulation protective layer. The conductive layer is covered by the anti-reflective coating layer and the second passivation layer, to avoid leakage of electricity.

In a specific implementable solution, the light source component further includes a QD material layer that is disposed between the anti-reflective coating layer and the second semiconductor layer and that covers the out-light surface of the second semiconductor layer. A color of light is converted by the QD material layer to emit light of different colors.

In a specific implementable solution, the out-light surface of the second semiconductor layer is provided with a plurality of filling holes. The QD material layer has a protrusion filled in the filling holes. Bonding strength between the QD material layer and the second semiconductor layer is enhanced through fitting between the filling holes and the protrusion.

In a specific implementable solution, the filling holes may be holes of different shapes, such as tapered holes or trapezoidal holes.

In a specific implementable solution, the filling holes are arranged regularly. For example, the filling holes are arranged evenly or arranged in an alternating dense and sparse manner.

In a specific implementable solution, the first semiconductor layer, the light emitting layer, and the second semiconductor layer are of an inverted trapezoidal structure. This improves a light output effect.

In a specific implementable solution, the side surfaces of the first semiconductor layer, the light emitting layer, and the second semiconductor layer have an inclination angle between 45° and 80° relative to the out-light surface. For example, the angle may be a different angle, such as 45°, 60°, and 80°.

According to a second aspect, a display apparatus is provided. The display apparatus includes a chip and the light source component according to any one of the above. The chip is configured to control the light source component to emit light. In the foregoing solutions, a side surface of a semiconductor layer of the light source component has a surface non-radiative recombination center. When the light source component works, the surface non-radiative recombination center captures a carrier in the semiconductor layer. This reduces light emitting efficiency of the light source component. To overcome the foregoing problem, the light source component in this disclosure is further provided with a conductive layer. The conductive layer may adjust and control, through electric field force, the carrier to be far away from surface non-radiative recombination centers of the first semiconductor layer and the second semiconductor layer. In this way, the carrier is far away from the surface non-radiative recombination center of the semiconductor layer under an action of the electric field force, thereby reducing a case in which the carrier is captured by the surface non-radiative recombination center, and improving the light output efficiency of the light source component.

According to a third aspect, a mobile terminal is provided. The mobile terminal includes a housing and a display apparatus disposed in the housing. In the foregoing solutions, a side surface of a semiconductor layer of the light source component has a surface non-radiative recombination center. When the light source component works, the surface non-radiative recombination center captures a carrier in the semiconductor layer. This reduces light emitting efficiency of the light source component. To overcome the foregoing problem, the light source component in this disclosure is further provided with a conductive layer. The conductive layer may adjust and control, through electric field force, the carrier to be far away from surface non-radiative recombination centers of the first semiconductor layer and the second semiconductor layer. In this way, the carrier is far away from the surface non-radiative recombination center of the semiconductor layer under an action of the electric field force, thereby reducing a case in which the carrier is captured by the surface non-radiative recombination center, and improving the light output efficiency of the light source component.

DESCRIPTION OF EMBODIMENTS

First, terms in this disclosure are described.

Radiative recombination: According to the energy conservation principle, some energy should be released when an electron and an electron hole are recombined. If the energy is released in a form of a photon, such recombination is called radiative recombination.

Non-radiative recombination: Recombination is classified into radiative recombination and non-radiative recombination based on a manner of energy release during the recombination. Recombination in which the energy is released in other manners than a radiation photon is called non-radiative recombination. The non-radiative recombination mainly includes multi-phonon recombination and auger recombination.

Semiconductor energy level: An electron can only move on a specific and discrete track. Electrons on each track have discrete energy. These energy values are energy levels. The electron may transit between different tracks. Energy absorbed by the electron may transit from a low energy level to a high energy level or from a high energy level to a low energy level, so that the energy is radiated.

Surface non-radiative recombination center: The surface non-radiative recombination center is a semiconductor energy level on a surface of a semiconductor material, including a semiconductor energy level formed by a defect on a surface of a light source component and a surface dangling bond. Non-radiative recombination of a carrier occurs in the surface non-radiative recombination center.

Figure 1:
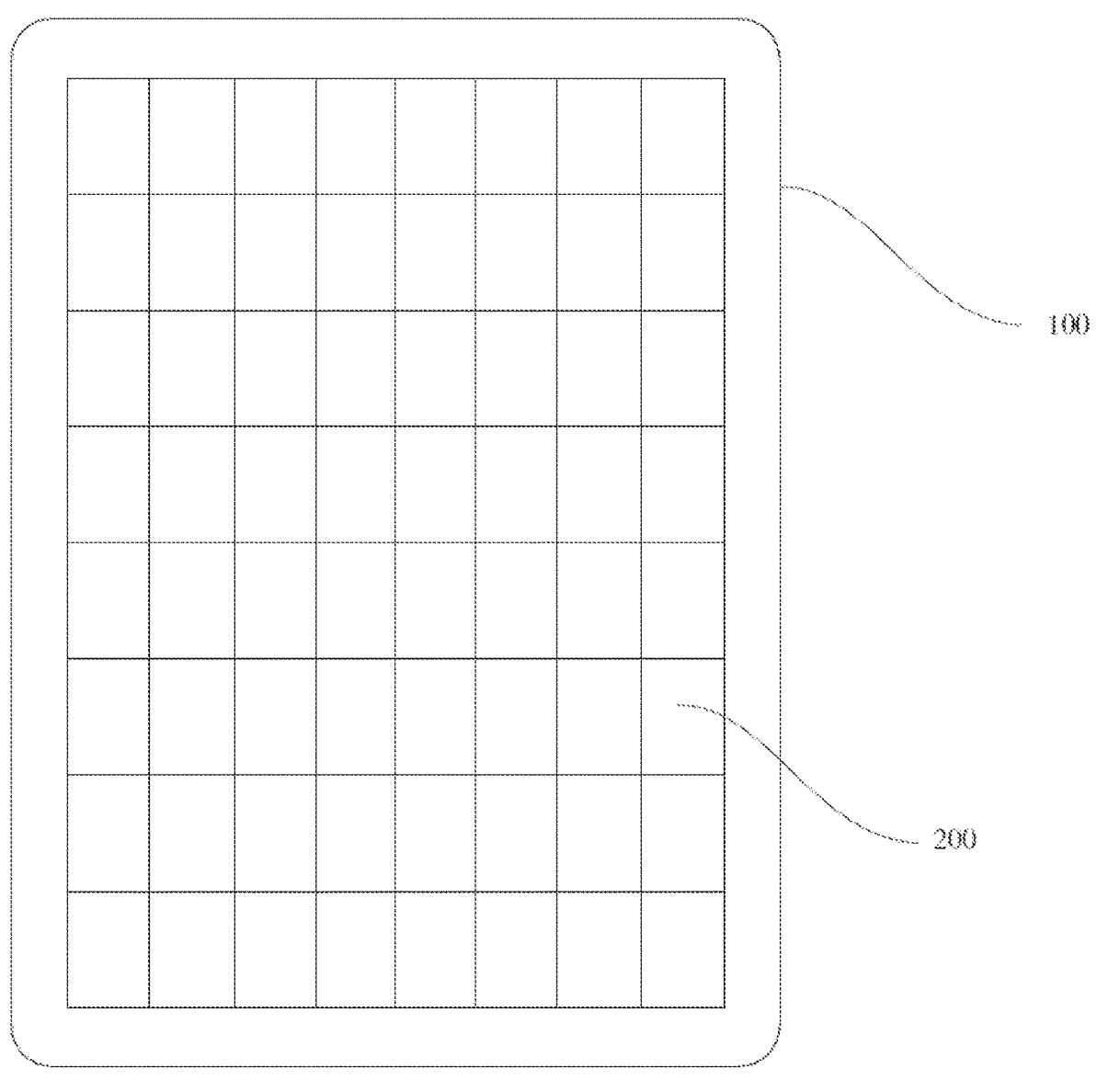
FIG. 1 is a schematic diagram of a structure of a mobile terminal in the conventional technology.

The light source component is a micro-LED, and may emit light of different colors according to a requirement. The light source component may be, for example, a micro-LED that emits red light, a micro-LED that emits blue light, and a micro-LED that emits green light. The light source component may be applied to a display apparatus, for example, a mobile phone, a tablet computer, or a wearable device. FIG. 1 is a schematic diagram of a structure of a light source component applied to a mobile terminal. A mobile terminal 100 includes a plurality of light source components 200. The plurality of light source components 200 are arranged in an array, and form a display layer of the mobile terminal. The light source components 200 emit light of different colors such as red, green, and blue, to implement image display.

A display scenario of a mobile terminal such as a watch or a mobile phone is very sensitive to power consumption of a micro-LED. The micro-LED needs to work at low current density and has high light emitting efficiency at the low current density. In addition, the micro-LED needs a small light emitting angle and high normal luminance to ensure sufficient light energy utilization, thereby ensuring that power consumption of a display module meets a system requirement. However, in the conventional technology, the micro-LED has low light emitting efficiency at low current density, and cannot meet a requirement of the display apparatus.

Figure 2:
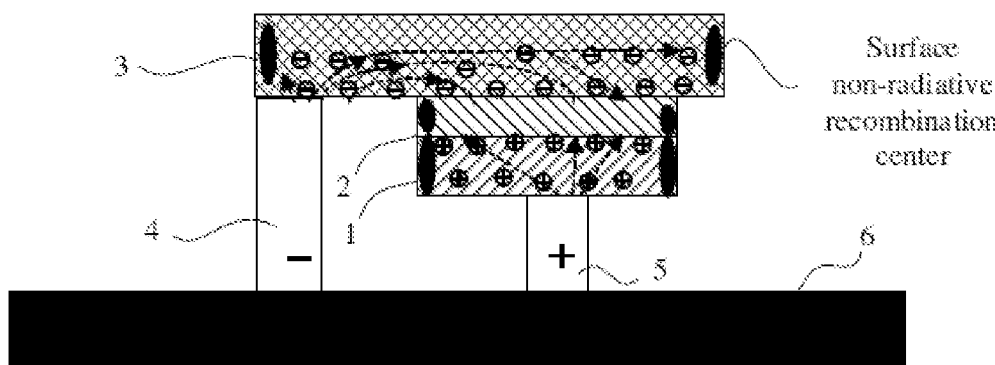
FIG. 2 is a schematic diagram of a structure of a light source component in the conventional technology.

FIG. 2 is a schematic diagram of low light emitting efficiency of a micro-LED in the conventional technology. A micro-LED includes a first semiconductor layer 1, a light emitting layer 2, and a second semiconductor layer 3 that are laminated. The first semiconductor layer 1 is connected to a first electrode 5, the second semiconductor layer 3 is connected to a second electrode 4, and the first electrode 5 and the second electrode 4 are connected to a circuit board 6. A surface that is of the second semiconductor layer 3 and that is away from the light emitting layer 2 is an out-light surface, and is also an out-light surface of the micro-LED. For ease of description, a side surface of the micro-LED is defined. The side surface of the micro-LED is a surface adjacent to the light emitting surface, and includes a side surface of the first semiconductor layer 1, a side surface of the second semiconductor layer 3, and a side surface of the light emitting layer 2. The side surface of the first semiconductor layer 1, the side surface of the second semiconductor layer 3, and the side surface of the light emitting layer 2 each have a surface non-radiative recombination center.

During light emission, an electron in the second semiconductor layer 3 moves toward the first semiconductor layer 1. In addition, an electron hole in the first semiconductor layer 1 moves toward the second semiconductor layer 3. The electron and the electron hole are radiatively recombined at the light emitting layer 2 to emit light. In a process of light emission, a carrier (the electron and the electron hole) is affected by the surface non-radiative recombination center, and non-radiative recombination occurs in the surface non-radiative recombination center. The carrier is captured by these surface non-radiative recombination centers and surface states, where the non-radiative recombination (recombination without light emission) of the carrier occurs, affecting light emitting efficiency.

With reference to the structure of the light source component shown in FIG. 2, due to a large diffusion distance of the carrier (the electron and the electron hole) in the first semiconductor layer 1 and the second semiconductor layer 3, some electrons and electron holes move to the side surface of the light source component, and are captured by a surface non-radiative recombination center on the side surface of the light source component. As shown in FIG. 2, the first semiconductor layer 1, the second semiconductor layer 3, and the light emitting layer 2 each have a surface non-radiative recombination center. The non-radiative recombination of the electron hole and the electron occurs in the surface non-radiative recombination center. This reduces the light emitting efficiency of the light source component. Therefore, an embodiment of this disclosure provides a light source component. The light source component is described below in detail with reference to specific accompanying drawings and embodiments.

Figure 3:
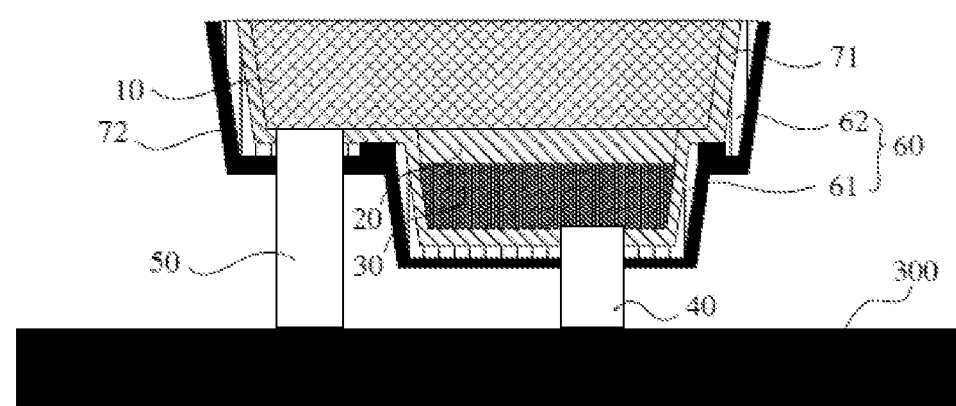
FIG. 3 is a schematic diagram of a structure of a light source component according to an embodiment of this disclosure.

FIG. 3 is a schematic diagram of a structure of a light source component according to an embodiment of this disclosure. A main structure of the light source component provided in this embodiment of this disclosure includes a plurality of laminated layer structures. The layer structures include a first semiconductor layer 30, a light emitting layer 20, and a second semiconductor layer 10 that are laminated. The light emitting layer 20 is located between the first semiconductor layer 30 and the second semiconductor layer 10. A surface that is of the second semiconductor layer 10 and that is away from the light emitting layer 20 is an out-light surface, and the out-light surface of the second semiconductor layer 10 is also an out-light surface of the light source component.

The first semiconductor layer 30 and the second semiconductor layer 10 are an N-type semiconductor layer and a P-type semiconductor layer, respectively. For example, the first semiconductor layer 30 is an N-type semiconductor layer, and the second semiconductor layer 10 is a P-type semiconductor layer; or the first semiconductor layer 30 is a P-type semiconductor layer, and the second semiconductor layer 10 is an N-type semiconductor layer. In this embodiment of this disclosure, description is made by using an example in which the first semiconductor layer 30 is an N-type semiconductor layer and the second semiconductor layer 10 is a P-type semiconductor layer.

The light emitting layer 20 is a transition layer located between the N-type semiconductor layer and the P-type semiconductor layer, and may also be referred to as a PN junction. After a forward voltage is applied to the light source component, an electron hole (injected from the N-type semiconductor layer to the P-type semiconductor layer) and an electron (injected from the P-type semiconductor layer to the N-type semiconductor layer) are recombined, to generate radiant light.

The light source component is provided with a first electrode 40 and a second electrode 50 that are configured to connect to a circuit board 300. The first semiconductor layer 30 is electrically connected to the first electrode 40, and the second semiconductor layer 10 is electrically connected to the second electrode 50. When fitting with the circuit board 300, the first electrode 40 and the second electrode 50 are connected to the circuit board 300 by welding or in another electrical connection manner. The first electrode 40 and the second electrode 50 may be a positive electrode and a negative electrode, respectively. For example, when the first semiconductor layer 30 is an N-type semiconductor layer, and the second semiconductor layer 10 is a P-type semiconductor layer, the first electrode 40 is a positive electrode, and the second electrode 50 is a negative electrode.

With reference to the conventional technology shown in FIG. 2, it can be learned that a side surface of the foregoing layer structure (the first semiconductor layer 30, the light emitting layer 20, and the second semiconductor layer 10) has a surface non-radiative recombination center. When the light source component works, the surface non-radiative recombination center captures a carrier in the layer structure. This reduces light emitting efficiency of the light source component. To overcome impact of the surface non-radiative recombination center on the light emitting efficiency, the light source component provided in this embodiment of this disclosure is provided with a conductive layer 60 on an outer side of side surfaces of the first semiconductor layer 30 and the second semiconductor layer 10. The conductive layer 60 is configured to adjust and control, through electric field force, the carrier to be away from a surface non-radiative recombination center of the first semiconductor layer 30 and a surface non-radiative recombination center of the second semiconductor layer 10. A material of the conductive layer 60 may be an electrically conductive non-metallic material or a metallic material. This is not specifically limited in this embodiment of this disclosure. For example, the material of the conductive layer 60 may be a material with a high conductivity such as silver, gold, aluminum, or copper.

Referring to FIG. 3, the conductive layer 60 includes a first conductive layer 61 and a second conductive layer 62. The first conductive layer 61 is located on an outer side of the side surface of the first semiconductor layer 30, and the second conductive layer 62 is located on an outer side of the side surface of the second semiconductor layer 10. To avoid a direct conductive connection between the first conductive layer 61 and the first semiconductor layer, and to avoid a direct conductive connection between the second conductive layer 62 and the second semiconductor layer, a first passivation layer 71 is disposed on an outer side of side surfaces of the first semiconductor layer 30, the light emitting layer 20, and the second semiconductor layer 10. The first passivation layer 71 covers an outer side of the side surface and a bottom wall of the first semiconductor layer 30, the side surface of the light emitting layer 20, and the side surface and a bottom wall of the second semiconductor layer 10. The first conductive layer 61 and the second conductive layer 62 cover an outer side of the first passivation layer 71. In this way, the first conductive layer 61 is isolated from the first semiconductor layer 30, and the first conductive layer 61 may only apply electric field force, and is not directly conductively connected to the first semiconductor layer 30. Similarly, the second conductive layer 62 may only apply electric field force to the second semiconductor layer 10, and is not directly conductively connected to the second semiconductor layer 10.

Figure 4:
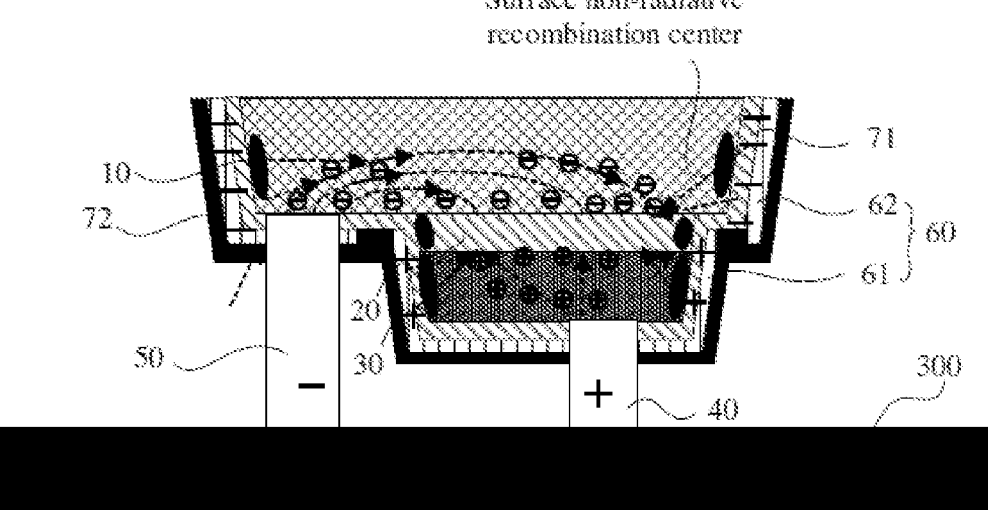
FIG. 4 is a schematic diagram of another structure of a light source component according to an embodiment of this disclosure.

FIG. 4 shows a working principle of a conductive layer according to an embodiment of this disclosure. The first conductive layer 61 is electrically connected to the first electrode 40. The second conductive layer 62 is electrically connected to the second electrode 50. The first conductive layer 61 is electrically isolated from the second conductive layer 62. In this way, the first conductive layer 61 and the first electrode 40 have a same voltage, and the second conductive layer 62 and the second electrode 50 have a same voltage. When the light source component works, the first conductive layer 61 may form an electric field (a positive electric field, for example, "+" shown in FIG. 4) pointing to the inside of the first semiconductor layer 30, and the second conductive layer 62 may form an electric field (a negative electric field, for example, "−" shown in FIG. 4) pointing to the side surface of the second semiconductor layer 10. According to a relationship between a movement direction of a carrier (an electron hole and an electron) and a direction of the electric field, an electron hole in the first semiconductor layer 30 is rejected by a positive voltage on the first conductive layer 61, and is thus away from the surface non-radiative recombination center on the side surface of the first semiconductor layer 30, thereby reducing a probability that the electron hole is captured by the surface non-radiative recombination center. Similarly, an electron in the second semiconductor layer 10 is rejected by a negative voltage on the second conductive layer 62, and is thus away from the surface non-radiative recombination center on the side surface of the second semiconductor layer 10, thereby reducing a probability that the electron is captured by the surface non-radiative recombination center. The action force of the electric field may reduce a case in which the carrier is captured by the surface non-radiative recombination center of the first semiconductor layer 30 and the surface non-radiative recombination center of the second semiconductor layer 10 during light emission of the light source component. More electrons and electron holes participate in a recombination and light emitting process, thereby improving the light emitting efficiency of the light source component. In this way, the light source component still has high light emitting efficiency at low current density.

In an optional solution, the first conductive layer 61 may further cover the side surface of the light emitting layer 20. In this way, an electric field applied by the first conductive layer 61 may act on the light emitting layer 20, thereby reducing capture of the electron hole by the surface non-radiative recombination center of the light emitting layer 20, and further improving the light emitting efficiency of the light source component. Alternatively, the second conductive layer 62 may cover the side surface of the light emitting layer 20, and a same effect may also be achieved.

In a manner in which the first electrode 40 and the second electrode 50 supply power to the first conductive layer 61 and the second conductive layer 62, respectively, the first conductive layer 61 and the second conductive layer 62 may be supplied with power when the light source component works, thereby simplifying the structure of the light source component. However, it should be understood that the foregoing manner of supplying power to the first conductive layer 61 and the second conductive layer 62 is only a specific power supply manner. The first conductive layer 61 and the second conductive layer 62 may also be supplied with power in another manner. For example, the light source component may further include a third electrode and a fourth electrode. The third electrode is connected to the first conductive layer 61, and the fourth electrode is connected to the second conductive layer 62. When connected to the circuit board 300, the third electrode and the fourth electrode each are connected to a circuit layer of the circuit board 300. In this way, the first conductive layer 61 and the second conductive layer 62 may also be supplied with power.

For ease of disposing the first conductive layer 61 and the second conductive layer 62, the first semiconductor layer 30, the light emitting layer 20, and the second semiconductor layer 10 are of an inverted trapezoidal structure. For example, the first semiconductor layer 30 is of an inverted trapezoidal structure. An area of a top surface of the first semiconductor layer 30 is greater than an area of a bottom surface of the first semiconductor layer 30. Similarly, the light emitting layer 20 and the first semiconductor layer 30 are also of an inverted trapezoidal structure. When the foregoing structure is adopted, the foregoing layer structure forms a specific gradient, to facilitate forming of the conductive layer.

In an optional solution, the first semiconductor layer 30, the light emitting layer 20, and the second semiconductor layer 10 may be of an isosceles trapezoidal structure, to facilitate preparation of the conductive layer by using a symmetric structure.

In an optional solution, the side surfaces of the first semiconductor layer 30, the light emitting layer 20, and the second semiconductor layer 10 have an inclination angle between 45° and 80° relative to the out-light surface. For example, included angles between the out-light surface and the side surfaces of the first semiconductor layer 30, the light emitting layer 20, and the second semiconductor layer 10 may be different angles such as 45°, 60°, and 80°.

It should be understood that structures of the first semiconductor layer 30, the light emitting layer 20, and the second semiconductor layer 10 shown in FIG. 3 are merely a specific example. In addition to the shape shown in FIG. 3, another shape of the first semiconductor layer 30, the light emitting layer 20, and the second semiconductor layer 10 may also be applicable to this embodiment of this disclosure. For example, only the first semiconductor layer 30 is of an inverted trapezoidal structure, or only the second semiconductor layer 10 is of an inverted trapezoidal structure.

In an optional solution, the light source component further includes a second passivation layer 72 that covers an outer side of the conductive layer 60. The second passivation layer 72 is disposed on the outer side of the conductive layer 60, and encapsulates the conductive layer 60, to avoid exposure of the conductive layer 60. This reduces an oxidation risk of the conductive layer 60, and improves reliability of the conductive layer 60. Referring to FIG. 3, during preparation of the second passivation layer 72, a protrusion (not marked in the figure) filled in a gap between the first conductive layer 61 and the second conductive layer 62 is formed. The first conductive layer 61 and the second conductive layer 62 may be electrically isolated by the protrusion, thereby improving an isolation effect between the first conductive layer 61 and the second conductive layer 62. In addition, the second passivation layer 72 and the first passivation layer 71 may further form a structure that protects each of the layer structures (the first semiconductor layer 30, the light emitting layer 20, and the second semiconductor layer 10) of the light source component, thereby improving safety of the foregoing layer structure.

Figure 5:
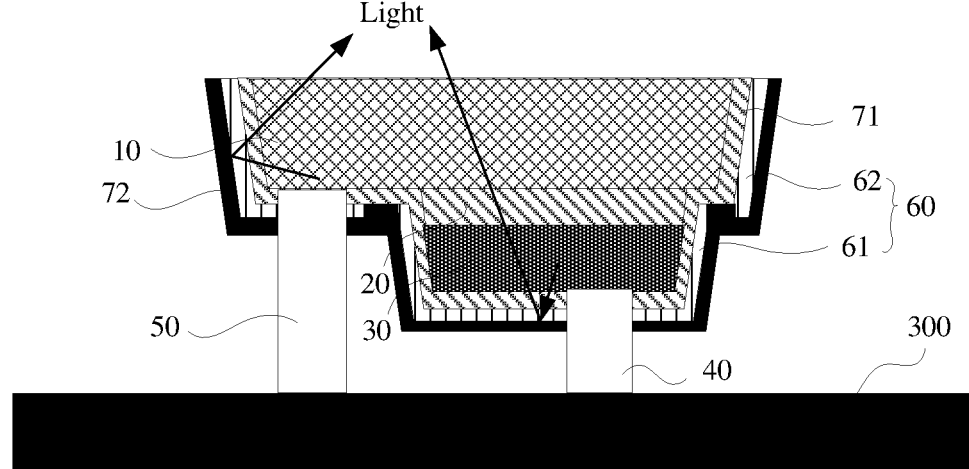
FIG. 5 is a schematic diagram of another structure of a light source component according to an embodiment of this disclosure.

FIG. 5 shows a variant structure based on the light source component shown in FIG. 3. For some reference numerals shown in FIG. 5, refer to the same reference numerals shown in FIG. 3. In addition to that the conductive layer 60 may be used as a structure for applying an electric field, a surface that is of the conductive layer 60 and that faces the first semiconductor layer 30 and the second semiconductor layer 10 is a reflective surface. For example, a surface that is of the first conductive layer 61 and that faces the first semiconductor layer 30 is a first reflective surface, and a surface that is of the second conductive layer 62 and that faces the second semiconductor layer 10 is a second reflective surface.

When the light source component emits light, refer to a straight line with an arrow in FIG. 5. The straight line represents an emission direction of some light. The some light may be emitted on a side surface of the light source component (the side surface of the first semiconductor layer 30, the side surface of the light emitting layer 20, and the side surface of the second semiconductor layer 10), affecting an amount of light output from the out-light surface. Therefore, when the conductive layer 60 is disposed, the surface that is of the first conductive layer 61 and that faces the first semiconductor layer 30 is used as the first reflective surface. Light emitted from the side surface of the first semiconductor layer 30 may be reflected by the first reflection layer and then emitted from the out-light surface, thereby increasing the amount of light output from the out-light surface. Similarly, light emitted from the side surface of the second semiconductor layer 10 may also be reflected by the second reflection layer and then emitted from the out-light surface.

Referring to FIG. 5, a part of the second semiconductor layer 10 protrudes outside the light emitting layer 20. To further reduce light emitted from another surface except the out-light surface, the second conductive layer 62 at least covers a part of a surface that is of the second semiconductor layer 10 and that is away from the out-light surface. Similarly, the first conductive layer 61 at least covers a part of a surface that is of the first semiconductor layer 30 and that is away from the out-light surface. In this way, light emitted from a bottom surface (the surface that is away from the light emitting surface) of the first semiconductor layer 30 and a bottom surface (the surface away from the light emitting surface) of the second semiconductor layer 10 may be reflected back into the light source component by the first reflective surface and the second reflective surface. Therefore, more light is reflected to the out-light surface of the light source component by the first reflective surface and the second reflective surface.

It can be learned from the foregoing description that the light source component provided in this embodiment of this disclosure not only has effect of the light source component shown in FIG. 3, but also may use the reflective surface (the first reflective surface and the second reflective surface) of the conductive layer to cover the side surface of the light source component and at least cover a part of each of surfaces that are of the first semiconductor layer 30 and the second semiconductor layer 10 and that are away from the out-light surface, thereby reducing the light emitted from the another surface of the light source component, improving the amount of light output from the out-light surface, and further improving the light emitting efficiency of the light source component.

Figure 6:
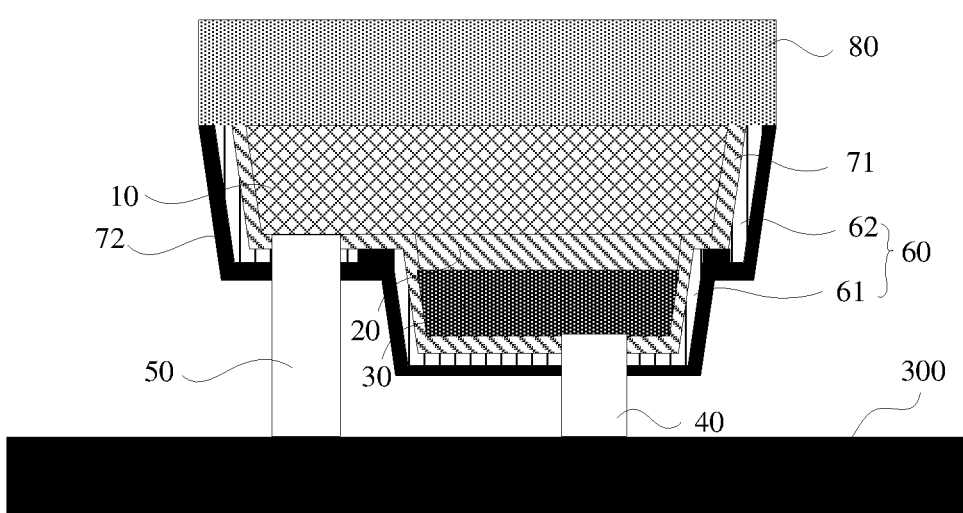
FIG. 6 is a schematic diagram of another structure of a light source component according to an embodiment of this disclosure.

FIG. 6 shows a variant structure based on the light source component shown in FIG. 3 or FIG. 5. For some reference numerals shown in FIG. 6, refer to the same reference numerals shown in FIG. 3.

When the light is emitted from the out-light surface of the second semiconductor layer 10, because a refractive index of the second semiconductor layer 10 is greater than a refractive index of air, light at some specified angles is totally reflected on the out-light surface. Total reflection means that when the light enters a medium with a lower refractive index from a medium with a higher refractive index, if an incident angle is greater than a critical angle, refracted light disappears, and all incident light is reflected and does not enter the medium with the lower refractive index. When refractive indexes of two media are similar, a larger critical angle indicates a lower probability of the total reflection. Therefore, an anti-reflective coating layer 80 is disposed on the out-light surface of the second semiconductor. Referring to the structure shown in FIG. 6, the anti-reflective coating layer 80 is attached to the out-light surface of the second semiconductor layer 10 and covers the out-light surface of the second semiconductor layer 10. The light emitted from the out-light surface of the second semiconductor layer 10 enters the anti-reflective coating layer. When the anti-reflective coating layer is disposed, the refractive index of the air <a refractive index of the anti-reflective coating layer 80 <the refractive index of the second semiconductor layer 10. That is, the refractive index of the anti-reflective coating layer 80 is between the refractive index of the air and the refractive index of the second semiconductor layer 10. In this way, a critical angle for total reflection between the anti-reflective coating layer 80 and the air is large, thereby reducing a case of the total reflection, allowing more light to be emitted into the air from the anti-reflective coating layer 80, and increasing an amount of light output from the light source component.

In an optional solution, the anti-reflective coating layer 80 is a layer structure with a gradient refractive index, and a refractive index of the anti-reflective coating layer gradually decreases in a direction away from the light emitting layer 20. For example, the anti-reflective coating layer 80 may be made of a SiOxNy material, where x and y are positive integers. A ratio of the element O to the element N in the SiOxNy is adjusted, so that the refractive index of the anti-reflective coating layer 80 prepared with the SiOxNy material becomes close to the refractive index of the air in external space from being close to the refractive index of the second semiconductor layer 10. The refractive index of the anti-reflective coating layer 80 gradually decreases in a direction in which the second semiconductor layer 10 points to external air. When the foregoing structure is used, a refractive index of a side that is of the anti-reflective coating layer 80 and that is close to the second semiconductor layer 10 is equal to the refractive index of the second semiconductor layer or less than the refractive index of the second semiconductor layer 10, and a refractive index of a side that is close to the air is greater than or equal to the refractive index of the air. In a process of light propagation, a difference between refractive indexes of adjacent layer structures (the second semiconductor layer 10 and the anti-reflective coating layer 80, and the anti-reflective coating layer 80 and the air) is reduced by using the anti-reflective coating layer 80, thereby reducing light with the total reflection and improving light output efficiency.

In an optional solution, the anti-reflective coating layer 80 covers the first passivation layer 71, the second conductive layer 62, and the second passivation layer 72. Referring to the structure shown in FIG. 6, when the anti-reflective coating layer 80 covers the foregoing layer structure, a size of the anti-reflective coating layer 80 is greater than a size of the second semiconductor layer 10, so that more light can be emitted through the anti-reflective coating layer 80, thereby improving light output efficiency of the light source component. In addition, when the foregoing structure is used, the anti-reflective coating layer 80 covers an exposed surface of the conductive layer, and the anti-reflective coating layer 80, the second passivation layer 72, and the first passivation layer 71 form an insulation protective layer covering the first conductive layer 61 and the second conductive layer 62. In this way, the first conductive layer 61 and the second conductive layer 62 are formed in a sealed space, thereby reducing a risk of oxidation of the first conductive layer 61 and the second conductive layer 62 and improving reliability of the first conductive layer 61 and the second conductive layer 62.

Figure 7:
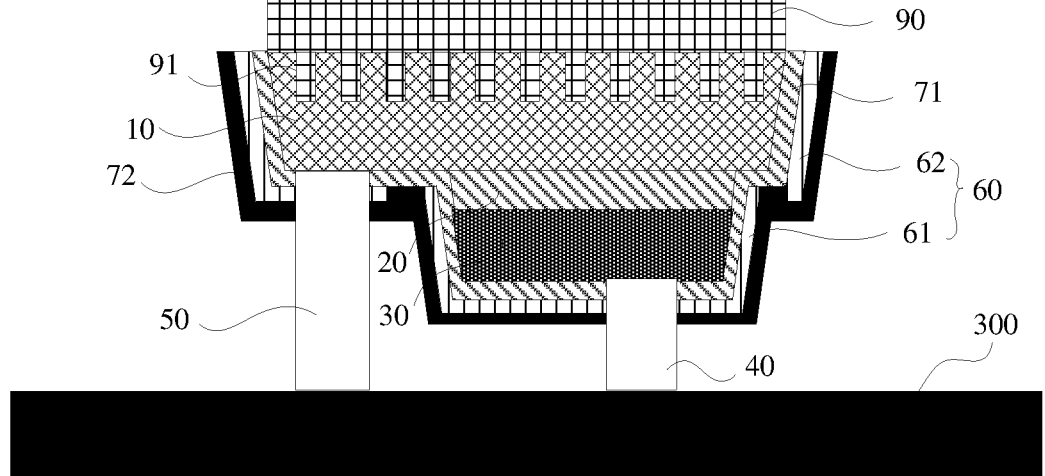
FIG. 7 is a schematic diagram of another structure of a light source component according to an embodiment of this disclosure.

FIG. 7 shows a variant structure based on the light source component shown in FIG. 3. For some reference numerals in FIG. 7, refer to the same reference numerals in FIG. 3.

Referring to the schematic diagram of the disclosure scenario shown in FIG. 1. The light source component needs to emit red, green, or blue light when being used. However, when the structure shown in FIG. 3 is used, light emitted by the light source component is single light. To implement emission of light of different colors such as red, blue, and green, the light source component provided in this embodiment of this disclosure further includes a QD (quantum dot) material layer. A QD material layer 90 covers the out-light surface of the second semiconductor layer 10. After light emitted from the second semiconductor layer 10 enters the QD material layer 90, the QD material layer 90 is excited to generate light of another color. For example, when the light emitted from the second semiconductor layer 10 is blue light, a QD material is excited by using the blue light, and red light is generated through color conversion. In addition, by adjusting chemical composition of the QD material layer 90, green light may further be generated after excitation by using the blue light. The chemical composition of the QD material layer 90 is known, and details are not described herein again.

In an optional solution, the out-light surface of the second semiconductor layer 10 is provided with a plurality of filling holes. The QD material layer 90 has a protrusion 91 filled in the filling holes. When the QD material layer 90 fits with the second semiconductor layer 10, a contact area between the QD material layer 90 and the second semiconductor layer 10 is increased through fitting between the protrusion 91 and the filling holes, thereby increasing connection strength between the QD material layer 90 and the second semiconductor layer 10. This ensures reliability of the QD material layer 90 after the QD material layer 90 is coated on the out-light surface of the second semiconductor layer 10. In addition, when the out-light surface of the second semiconductor layer 10 is provided with the plurality of filling holes, a side surface of the filling hole may also output light. This may be equivalent to increasing an area of the out-light surface, and further increases the light output efficiency of the light source component.

In an optional solution, the filling holes may be holes of different shapes, such as rectangular holes, tapered holes or trapezoidal holes. For example, the filling holes may be tapered holes or trapezoidal holes. When the foregoing hole pattern is used, the side surface of the filling hole has a specific gradient, so that the filling hole is filled when the QD material layer 90 is coated, thereby avoiding bubbles. In addition, when a structure in which the filling hole has a specific gradient is used, an incident angle of light irradiating on the side surface of the filling hole may be reduced, thereby reducing the case of the total reflection, and improving the light output efficiency.

In an optional solution, the plurality of filling holes are arranged regularly. For example, the plurality of filling holes may be arranged evenly or arranged in an alternating dense and sparse manner. For example, the plurality of filling holes are arranged in an array manner, or the plurality of filling holes are arranged in a different manner such as a ring with nested layers.

In an optional solution, a size of the QD material layer 90 is the same as a size of the out-light surface of the second semiconductor layer 10, to ensure that all light emitted from the out-light surface of the second semiconductor layer 10 may be emitted through the QD material layer 90. It should be understood that, in this embodiment of this disclosure, the size of the QD material layer 90 should at least be not less than the size of the out-light surface of the second semiconductor layer 10. The size of the QD material layer 90 may be greater than the size of the out-light surface of the second semiconductor layer 10. For example, the size of the QD material layer 90 may be further greater than the size of the out-light surface of the second semiconductor layer 10. The size of the QD material layer 90 is a size of a surface that is of the QD material layer 90 and that faces the second semiconductor layer 10.

It can be learned from the foregoing description that, in addition to implementing effect of the light source component shown in FIG. 3, the light source component shown in FIG. 7 may further emit light of different colors relative to the light source component shown in FIG. 3. When the display apparatus shown in FIG. 1 is formed, some light source components may be the light source component shown in FIG. 3, and some light source components may be the light source component shown in FIG. 7. In this way, the display apparatus may emit light of different colors such as red, blue, and green. Certainly, the light source component provided in this embodiment of this disclosure may further emit light of another color according to a requirement of the display apparatus, and only the chemical composition of the QD material layer 90 needs to be adjusted.

Figure 8:
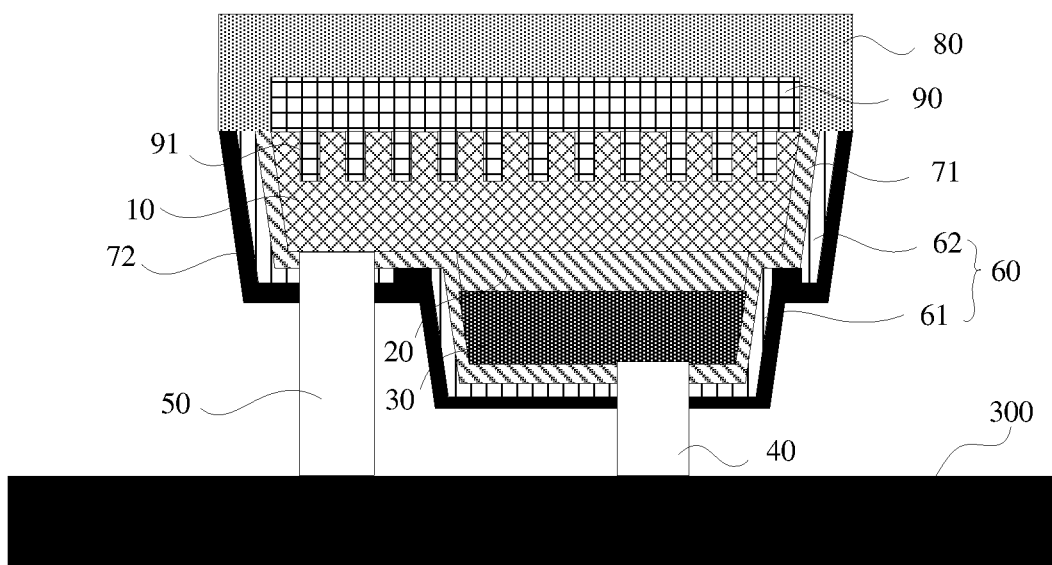
FIG. 8 is a schematic diagram of another structure of a light source component according to an embodiment of this disclosure.

FIG. 8 shows a variant structure based on the light source component shown in FIG. 3. For some reference numerals in FIG. 8, refer to the same reference numerals in FIG. 3. The light source component shown in FIG. 8 may be considered as a combination of the light source components shown in FIG. 6 and FIG. 7.

In addition to including the basic structure shown in FIG. 3, the light source component further includes the anti-reflective coating layer 80 and the QD material layer 90. The QD material layer 90 is disposed between the anti-reflective coating layer 80 and the second semiconductor layer 10, and covers the out-light surface of the second semiconductor layer 10.

In an optional solution, the anti-reflective coating layer 80 covers the QD material layer 90. When the anti-reflective coating layer 80 is formed, a side surface of the QD material layer 90 is covered, and light emitted from any surface of the anti-reflective coating layer 80 may be emitted after passing through the anti-reflective coating layer 80.

The refractive index of the anti-reflective coating layer 80 shown in FIG. 8 meets a condition that the refractive index of the air <the refractive index of the anti-reflective coating layer 80 <a refractive index of the QD material layer 90. That is, the refractive index of the anti-reflective coating layer 80 is between the refractive index of the air and the refractive index of the QD material layer 90. In this way, a critical angle for total reflection between the anti-reflective coating layer 80 and the air is large, thereby reducing a case of the total reflection, allowing more light to be emitted into the air from the anti-reflective coating layer 80, and increasing an amount of light output from the light source component.

In an optional solution, the anti-reflective coating layer 80 is a layer structure with a gradient refractive index, and a refractive index of the anti-reflective coating layer gradually decreases in a direction away from the light emitting layer 20. For example, a refractive index of a side that is of the anti-reflective coating layer 80 and that is close to the QD material layer 90 is equal to the refractive index of the second semiconductor layer or less than the refractive index of the QD material layer 90, and a refractive index of a side that is close to the air is greater than or equal to the refractive index of the air. In a process of light propagation, a difference between refractive indexes of adjacent layer structures (the QD material layer 90 and the anti-reflective coating layer 80, and the anti-reflective coating layer 80 and the air) is reduced by using the anti-reflective coating layer 80, thereby reducing light with the total reflection and improving light output efficiency.

In an optional solution, the anti-reflective coating layer 80 may further cover the first passivation layer 71, the second conductive layer 62, and the first passivation layer 71. For details, refer to related description in FIG. 7. Details are not described herein again.

To facilitate understanding of the light source component shown in FIG. 8, the following describes a preparation process of the light source component in detail.

Step 001: Epitaxial growth: sequentially grow epitaxial structures such as the first semiconductor layer 30, the light emitting layer 20, and the second semiconductor layer 10 on a surface of a substrate, to prepare a basic layer structure of the light source component.

Step 002: Step etching: etch the first semiconductor layer 30, the light emitting layer 20, and the second semiconductor layer 10 by using an etching method, so that widths of the first semiconductor layer 30, the light emitting layer 20, and the second semiconductor layer 10 are sequentially increased, to form an inclined side surface. Specifically, the widths gradually increase in a direction of the first semiconductor layer 30, the light emitting layer 20, and the second semiconductor layer 10, so that the light source component has an inclined side surface. For example, an inclination angle is 60 degrees.

Step 003: Preparation of the first passivation layer 71 and an electrode: deposit the first passivation layer 71 on surfaces and side surfaces of the first semiconductor layer 30, the light emitting layer 20, and the second semiconductor layer 10, prepare the first electrode 40 on the surface of the first semiconductor layer 30, and prepare the second electrode 50 on a surface that is of the second semiconductor layer 10 and that is exposed after etching.

Step 004: Preparation of the conductive layer: deposit a metallic material on the side surface of the second semiconductor layer 10 to form the second conductive layer 62; and deposit a metallic material on the surfaces and side surfaces of the first semiconductor layer 30 and the light emitting layer 20 to form the second conductive layer 62, where the first conductive layer 61 and the second conductive layer 62 are electrically isolated.

The first semiconductor layer 30 and the light emitting layer 20 are covered by the first conductive layer 61, and the second semiconductor layer 10 is covered by the second conductive layer 62. The conductive layer is made of a metallic thin film material with high reflectivity, to converge light emitted from the light emitting layer 20 to the out-light surface of the second semiconductor layer 10 for emission, thereby reducing a proportion of light output from the side surface.

Step 005: Preparation of the second passivation layer 72: deposit the second passivation layer 72 on an outer side of the conductive layer.

Step 006: Removal of the substrate: transfer the formed layer structure onto a wafer, and then remove the original substrate, that is, flip the layer structure, so that the second semiconductor layer 10 is above the first semiconductor layer 30.

Step 007: Thinning processing: etch the second semiconductor layer 10 by using an etching method, to thin the second semiconductor layer 10. After the thinning processing, a thickness of the first semiconductor layer 30 is 200 nm, a thickness of the light emitting layer 20 is 100 nm, and a thickness of the second semiconductor layer 10 is 2.5 μm. In addition, a total thickness of the first semiconductor layer 30, the light emitting layer 20, and the second semiconductor layer 10 is less than 3 μm.

Step 008: Preparation of the filling holes: etch, on the surface of the second semiconductor layer 10 by using a photoetching or nanoimprinting method, filling holes that are arranged regularly. Specifically, circular filling holes that are arranged regularly are provided on the surface of the second semiconductor layer 10. A depth of the filling holes is 500 nm, a diameter is 500 nm, and an interval is 1 μm.

Step 009: QD filling: coat the surface of the second semiconductor layer 10 with a QD material, so that all filling holes on the surface of the second semiconductor layer 10 are filled with the QD material. The filling holes are filled with the QD material layer 90, so that the contact area between the QD material layer 90 and the second semiconductor layer 10 is increased, and stability of the QD material layer 90 is improved.

Step 010: Formation of the anti-reflective coating layer 80: deposit a layer of an anti-reflective coating material with a gradient refractive index on the out-light surface of the second semiconductor layer 10, to form the anti-reflective coating layer 80.

A thickness of the anti-reflective coating layer 80 is 1 μm. The anti-reflective coating layer 80 is prepared from a thin film material with a gradient refractive index, and the refractive index of the anti-reflective coating layer 80 gradually decreases in a direction away from the light emitting layer 20. For example, the anti-reflective coating layer 80 may be made of a $SiO_xN_y$ material, where x and y are positive integers. A ratio of the element O to the element N in the $SiO_xN_y$ is adjusted, so that the refractive index of the anti-reflective coating layer 80 prepared with the $SiO_xN_y$ material becomes close to the refractive index of the air in external space from being close to the refractive index of the second semiconductor layer 10. The refractive index of the anti-reflective coating layer 80 gradually decreases in a direction in which the second semiconductor layer 10 points to external air. When the foregoing structure is used, a refractive index of a side that is of the anti-reflective coating layer 80 and that is close to the second semiconductor layer 10 is equal to the refractive index of the second semiconductor layer or less than the refractive index of the second semiconductor layer 10, and a refractive index of a side that is close to the air is greater than or equal to the refractive index of the air. In a process of light propagation, a difference between refractive indexes of adjacent layer structures (the second semiconductor layer 10 and the anti-reflective coating layer 80, and the anti-reflective coating layer 80 and the air) is reduced by using the anti-reflective coating layer 80, thereby reducing light with the total reflection and improving light output efficiency.

It can be learned from the foregoing description that, a thickness of the light source component prepared by using the foregoing preparation method is less than 3 μm. An area of the side surface of the light source component is reduced, and non-radiative recombination of the carrier in a surface non-radiative recombination center on the side surface of the light source component is reduced, thereby improving the light emitting efficiency and reducing a proportion of light emitted from the side surface.

In addition, the light source component has an inclined side surface. The side surface is covered by the conductive layer, and has effect of converging light, so that light may be reflected to a front surface of the light source component for emission. This reduces the proportion of the light output from the side surface of the light source component, makes an angle of emitted light concentrated, and improves normal luminance.

The conductive layer is connected to the electrode. A surface of the conductive layer is energized, and distribution of carriers in the light source component may be adjusted and controlled by using an electric field. The first conductive layer 61 makes a carrier in the first semiconductor layer 30 away from the side surface of the first semiconductor layer 30, and the second conductive layer 62 makes a carrier in the second semiconductor layer 10 away from the side surface of the second semiconductor layer 10, to avoid non-radiative recombination of the carrier in the surface non-radiative recombination center on the side surface, thereby improving the light emitting efficiency.

The QD material layer 90 is filled in the filling hole in the second semiconductor layer 10. This increases a contact area between the emitted light and the QD material layer 90, and improves color conversion efficiency. In addition, by using an adsorption principle of the filling hole, the QD material layer 90 is distributed stably, and has high mechanical strength, thereby improving reliability of the light source component.

The anti-reflective coating layer 80 can improve the light output efficiency of the light source component, isolate water and oxygen, and protect the QD material layer 90.

When the light emitting efficiency of the light source component is greatly affected by capture of an electron hole by the surface non-radiative recombination center, the conductive layer may be disposed only for the capture of the electron hole by the surface non-radiative recombination center. For example, referring to FIG. 9, the conductive layer includes a third conductive layer 63. The third conductive layer 63 is located on an outer side of the side surfaces of the first semiconductor layer 30, the light emitting layer 20, and the second semiconductor layer 10. The third conductive layer 63 is electrically connected to the first electrode 40, and is isolated from the second electrode 50. When the first electrode 40 conducts electricity to the third conductive layer 63, a positive electric field applied by the third conductive layer 63 may drive an electron hole in the first semiconductor layer 30 to be away from the surface non-radiative recombination center on the side surface of the first semiconductor layer 30. FIG. 10 shows another variant structure based on the light source component shown in FIG. 3. The conductive layer includes only the first conductive layer 61. The first conductive layer 61 is electrically connected to the first electrode 40. A positive electric field applied by the first conductive layer 61 may drive the electron hole in the first semiconductor layer 30 to be away from the surface non-radiative recombination center on the side surface of the first semiconductor layer 30.

Figure 9:
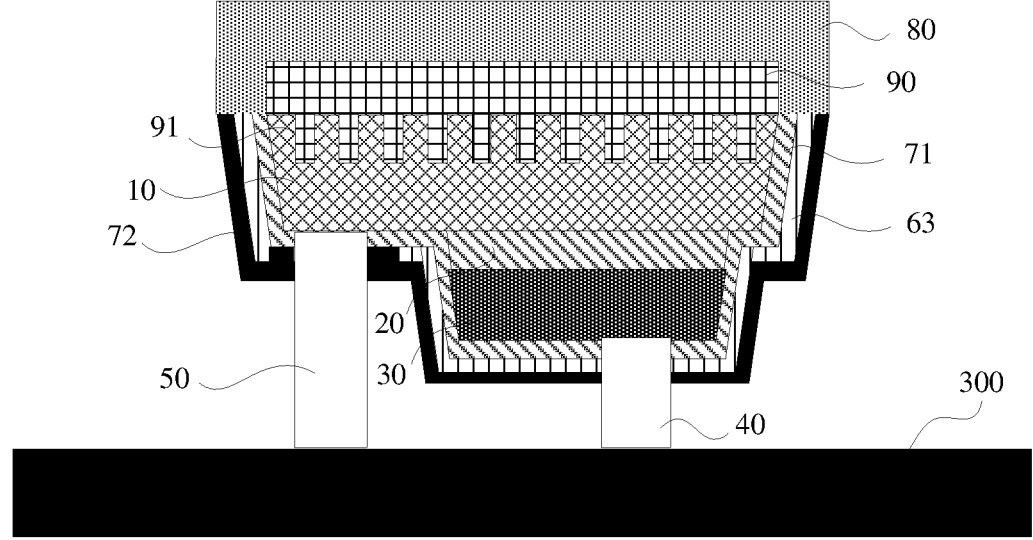
FIG. 9 is a schematic diagram of another structure of a light source component according to an embodiment of this disclosure.
Figure 10:
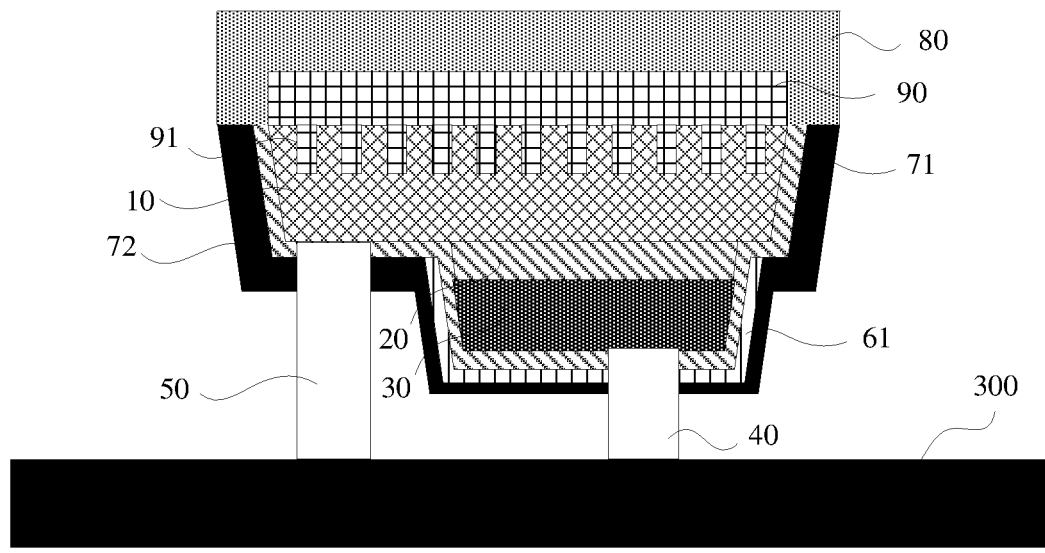
FIG. 10 is a schematic diagram of another structure of a light source component according to an embodiment of this disclosure.

When the conductive layer has a reflective surface, using FIG. 9 as an example, the third conductive layer 63 at least covers a part of each of the surfaces that are of the first semiconductor layer 30 and the second semiconductor layer 10 and that are away from the out-light surface. For example, the third conductive layer 63 covers only the surface that is of the first semiconductor layer 30 and that is away from the out-light surface, or covers only the surface that is of the second semiconductor layer 10 and that is away from the out-light surface, or covers both the surfaces that are of the first semiconductor layer 30 and the second semiconductor layer 10 and that are away from the out-light surface. FIG. 10 is used as an example. Light is reflected only by the first reflective surface on the first conductive layer 61. For a specific reflection principle, refer to the related description in FIG. 5.

When the light emitting efficiency of the light source component is greatly affected by capture of an electron by the surface non-radiative recombination center, the conductive layer may be disposed only for the capture of the electron by the surface non-radiative recombination center. For example, Referring to FIG. 11, the conductive layer includes a third conductive layer 63. The third conductive layer 63 is located on an outer side of the side surfaces of the first semiconductor layer 30, the light emitting layer 20, and the second semiconductor layer 10. The third conductive layer 63 is electrically connected to the second electrode 50, and is isolated from the first electrode 40. When the second electrode 50 conducts electricity to the third conductive layer 63, a negative electric field applied by the third conductive layer 63 may drive an electron in the second semiconductor layer 10 to be away from the surface non-radiative recombination center on the side surface of the second semiconductor layer 10. FIG. 10 shows another variant structure based on the light source component shown in FIG. 3. The conductive layer includes only the second conductive layer 62. The second conductive layer 62 is electrically connected to the first electrode 40. A negative electric field applied by the second conductive layer 62 may drive the electron in the second semiconductor layer 10 to be away from the surface non-radiative recombination center on the side surface of the second semiconductor layer 10.

FIG. 9 is used as an example. When the conductive layer has a reflective surface, the third conductive layer 63 at least covers a part of each of the surfaces that are of the first semiconductor layer 30 and the second semiconductor layer 10 and that are away from the out-light surface. For example, the third conductive layer 63 covers only the surface that is of the first semiconductor layer 30 and that is away from the out-light surface, or covers only the surface that is of the second semiconductor layer 10 and that is away from the out-light surface, or covers both the surfaces that are of the first semiconductor layer 30 and the second semiconductor layer 10 and that are away from the out-light surface. All this may be applicable to the light source component provided in this embodiment of this disclosure. FIG. 10 is used as an example. Light is reflected only by the second reflective surface on the second conductive layer 62. For a specific reflection principle, refer to the related description in FIG. 5.

Figure 11:
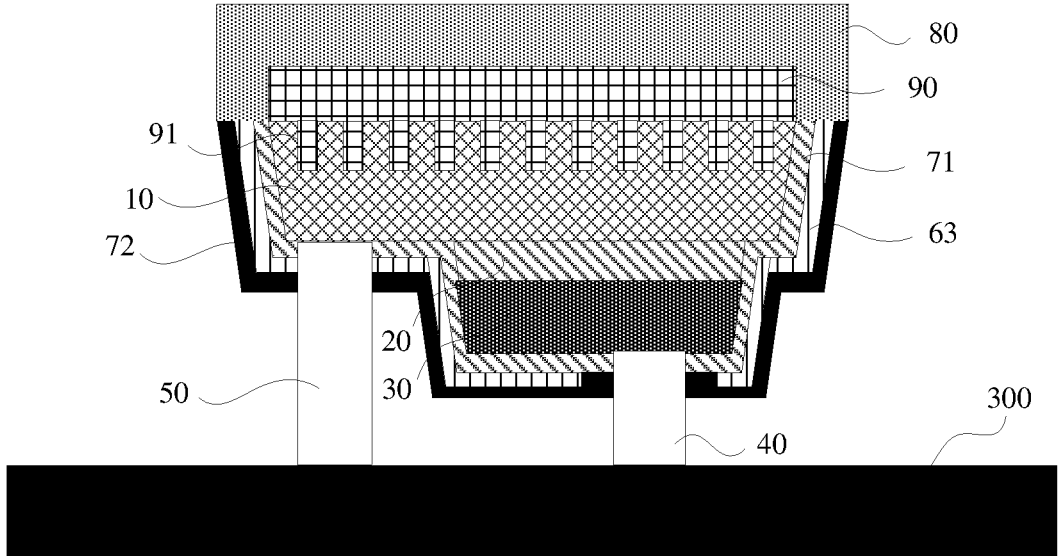
FIG. 11 is a schematic diagram of another structure of a light source component according to an embodiment of this disclosure.
Figure 12:
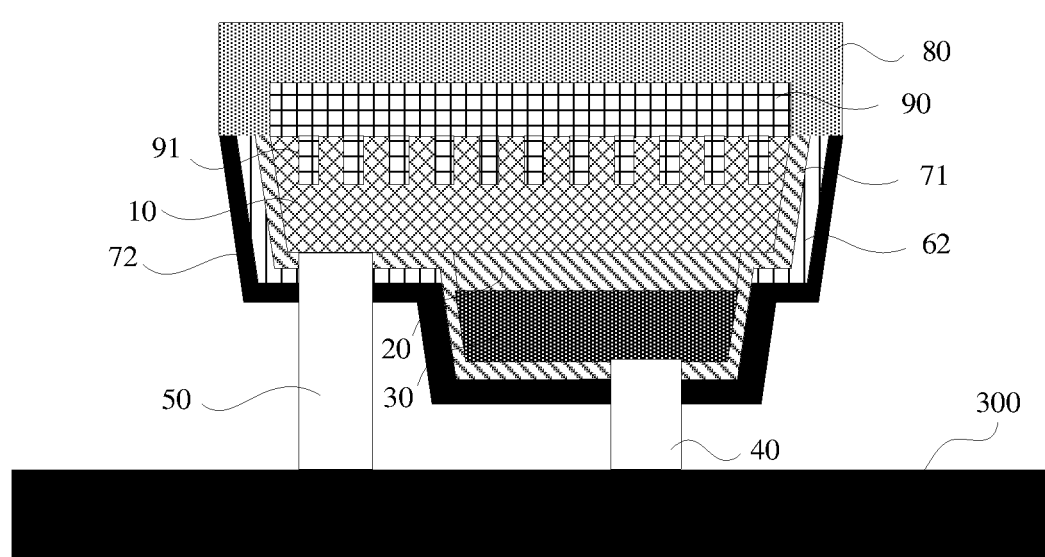
FIG. 12 is a schematic diagram of another structure of a light source component according to an embodiment of this disclosure.

It can be learnt from the light source component shown in FIG. 3, and FIG. 9 to FIG. 12 that the light source component provided in this embodiment of this disclosure, by using the conductive layer disposed, may adjust and control, through electric field force, the carrier to be far away from a surface non-radiative recombination center on a side surface of at least one of the first semiconductor layer and the second semiconductor layer. In this way, the carrier is far away from the surface non-radiative recombination center of the semiconductor layer under an action of the electric field force, thereby reducing a case in which the carrier is captured by the surface non-radiative recombination center, and improving the light output efficiency of the light source component. In addition, the conductive layer at least covers the side surface of the first semiconductor layer 30 and the side surface of the second semiconductor layer 10. The conductive layer is electrically connected to at least one of the first electrode 40 and the second electrode 50. This simplifies the structure of the entire light source component. The conductive layer shown in FIG. 3 includes the first conductive layer 61 and the second conductive layer 62. The first conductive layer 61 is connected to the first electrode 40, and the second conductive layer 62 is connected to the second electrode 50. Alternatively, the conductive layer shown in FIG. 9 and FIG. 10 is connected only to the first electrode 40, or the conductive layer shown in FIG. 11 and FIG. 12 is connected only to the second electrode 50. The first electrode 40 or the second electrode 50 is used as a connection terminal of the conductive layer. When the light source component is used, an electric field force is applied, by using the conductive layer, to a carrier close to the surface non-radiative recombination center, so that the carrier is away from the surface non-radiative recombination center, thereby improving light emitting efficiency of the light source component.

An embodiment of this disclosure further provides a display apparatus. The display apparatus includes a chip and the light source component according to any one of the above. The chip is configured to control the light source component to emit light. In the foregoing solutions, a side surface of a semiconductor layer of the light source component has a surface non-radiative recombination center. When the light source component works, the surface non-radiative recombination center captures a carrier in the semiconductor layer. This reduces light emitting efficiency of the light source component. To overcome the foregoing problem, the light source component in this disclosure is further provided with a conductive layer. The conductive layer may adjust and control, through electric field force, the carrier to be far away from surface non-radiative recombination centers of the first semiconductor layer and the second semiconductor layer. In this way, the carrier is far away from the surface non-radiative recombination center of the semiconductor layer under an action of the electric field force, thereby reducing a case in which the carrier is captured by the surface non-radiative recombination center, and improving light output efficiency of the light source component.

An embodiment of this disclosure further provides a mobile terminal. The mobile terminal includes a housing and a display apparatus disposed in the housing. In the foregoing solutions, a side surface of a semiconductor layer of the light source component has a surface non-radiative recombination center. When the light source component works, the surface non-radiative recombination center captures a carrier in the semiconductor layer. This reduces light emitting efficiency of the light source component. To overcome the foregoing problem, the light source component in this disclosure is further provided with a conductive layer. The conductive layer may adjust and control, through electric field force, the carrier to be far away from surface non-radiative recombination centers of the first semiconductor layer and the second semiconductor layer. In this way, the carrier is far away from the surface non-radiative recombination center of the semiconductor layer under an action of the electric field force, thereby reducing a case in which the carrier is captured by the surface non-radiative recombination center, and improving light output efficiency of the light source component.

It is clear that a person skilled in the art can make various modifications and variations to this disclosure without departing from the spirit and scope of this disclosure. This disclosure is intended to cover these modifications and variations of this disclosure provided that they fall within the scope of protection defined by the following claims and their equivalent technologies.

What is claimed is:

1. A light source component comprising: a first semiconductor layer, a light emitting layer, and a second semiconductor layer that are laminated, wherein:

the light emitting layer is located between the first semiconductor layer and the second semiconductor layer, a surface that is of the second semiconductor layer and that is away from the light emitting layer is an out-light surface, and a side surface of the first semiconductor layer has a first surface non-radiative recombination center and a side surface of the second semiconductor layer has a second surface non-radiative recombination center; and the light source component further comprises a conductive layer configured to adjust and control, through an electric field force, a carrier to be away from at least one of the first or second surface non-radiative recombination centers.

2. The light source component according to claim 1, wherein the conductive layer at least covers the side surface of the first semiconductor layer and the side surface of the second semiconductor layer;

the light source component further comprises: a first electrode electrically connected to the first semiconductor layer and a second electrode electrically connected to the second semiconductor layer; and the conductive layer is electrically connected to at least one of the first electrode and/or the second electrode.

3. The light source component according to claim 2, wherein the conductive layer comprises: a first conductive layer and a second conductive layer that are electrically isolated;

the first conductive layer is located on an outer side of the side surface of the first semiconductor layer, and the second conductive layer is located on an outer side of the side surface of the second semiconductor layer; and the first conductive layer is electrically connected to the first electrode, and the second conductive layer is electrically connected to the second electrode.

4. The light source component according to claim 2, wherein the conductive layer comprises a third conductive layer, and the third conductive layer is located on an outer side of side surfaces of the first semiconductor layer, the light emitting layer, and the second semiconductor layer; and the third conductive layer is electrically connected to the first electrode, or the third conductive layer is electrically connected to the second electrode.

5. The light source component according to claim 1, wherein a surface that is of the conductive layer and that faces the first semiconductor layer and the second semiconductor layer is a reflective surface.

6. The light source component according to claim 5, wherein the reflective surface of the conductive layer at least covers a part of each of surfaces that are of the first semiconductor layer and the second semiconductor layer and that are away from the out-light surface.

7. The light source component according to claim 1, wherein the light source component further comprises a passivation layer that covers the side surface of the first semiconductor layer, the side surface of the light emitting layer, and the side surface of the second semiconductor layer; and the conductive layer covers an outer side of the passivation layer.

8. The light source component according to claim 1, wherein the light source component further comprises a passivation layer that covers an outer side of the conductive layer.

9. The light source component according to claim 1, wherein the light source component further comprises an anti-reflective coating layer disposed on the out-light surface.

10. The light source component according to claim 9, wherein the anti-reflective coating layer is a layer structure with a gradient refractive index, and the gradient refractive index of the anti-reflective coating layer gradually decreases in a direction away from the light emitting layer.

11. The light source component according to claim 9, wherein the light source component further comprises a QD material layer that is disposed between the anti-reflective coating layer and the second semiconductor layer and that covers the out-light surface of the second semiconductor layer.

12. The light source component according to claim 11, wherein the out-light surface of the second semiconductor layer is provided with a plurality of filling holes; and the QD material layer has a protrusion filled in the filling holes.

13. The light source component according to claim 12, wherein the filling holes are arranged regularly.

14. The light source component according to claim 1, wherein the first semiconductor layer, the light emitting layer, and the second semiconductor layer are of an inverted trapezoidal structure.

15. The light source component according to claim 14, wherein the side surfaces of the first semiconductor layer, the light emitting layer, and the second semiconductor layer have an inclination angle between 45° and 80° relative to the out-light surface.

16. A display apparatus comprising a chip and a light source component, wherein:

the chip is configured to control the light source component to emit light, the light source component comprises: a first semiconductor layer, a light emitting layer, and a second semiconductor layer that are laminated, the light emitting layer is located between the first semiconductor layer and the second semiconductor layer, a surface that is of the second semiconductor layer and that is away from the light emitting layer is an out-light surface, and a side surface of the first semiconductor layer has a first surface non-radiative recombination center and a side surface of the second semiconductor layer has a second surface non-radiative recombination center; and the light source component further comprises a conductive layer configured to adjust and control, through an electric field force, a carrier to be away from at least one of the first or second surface non-radiative recombination centers.

17. The display apparatus according to claim 16, wherein:

the conductive layer at least covers the side surface of the first semiconductor layer and the side surface of the second semiconductor layer;

the light source component further comprises: a first electrode electrically connected to the first semiconductor layer and a second electrode electrically connected to the second semiconductor layer; and the conductive layer is electrically connected to at least one of the first electrode and/or the second electrode.

18. The display apparatus according to claim 17, wherein:

the conductive layer comprises: a first conductive layer and a second conductive layer that are electrically isolated;

the first conductive layer is located on an outer side of the side surface of the first semiconductor layer, and the second conductive layer is located on an outer side of the side surface of the second semiconductor layer; and the first conductive layer is electrically connected to the first electrode, and the second conductive layer is electrically connected to the second electrode.

19. The display apparatus according to claim 17, wherein the conductive layer comprises a third conductive layer, and the third conductive layer is located on an outer side of side surfaces of the first semiconductor layer, the light emitting layer, and the second semiconductor layer; and the third conductive layer is electrically connected to the first electrode, or the third conductive layer is electrically connected to the second electrode.

20. A mobile terminal comprising: a housing and a display apparatus that is disposed in the housing, wherein:

the display apparatus comprises: a chip and the light source component, the chip is configured to control the light source component to emit light, the light source component comprises: a first semiconductor layer, a light emitting layer, and a second semiconductor layer that are laminated, the light emitting layer is located between the first semiconductor layer and the second semiconductor layer, a surface that is of the second semiconductor layer and that is away from the light emitting layer is an out-light surface, and a side surface of the first semiconductor layer has a first surface non-radiative recombination center and a side surface of the second semiconductor layer has a second surface non-radiative recombination center; and the light source component further comprises a conductive layer configured to adjust and control, through an electric field force, a carrier to be away from at least one of the first or second surface non-radiative recombination centers.

* * * * *